US012771154B2

(12) United States Patent
Li et al.

(10) Patent No.: US 12,771,154 B2

(45) Date of Patent: Oct. 20, 2026

(54) ELECTRICAL APPARATUSES

(71) Applicant: GP Electronics (HK) Limited, Hong Kong (CN)

(72) Inventors: Yiu Cheung Brian Li, Hong Kong (CN); Yat Ming Wong, Hong Kong (CN); Yui Ho Chan, Hong Kong (CN); De Qing Zeng, Hong Kong (CN)

(73) Assignee: GP Electronics (HK) Limited, Hong Kong (CN)

( * ) Notice: Subject to any disclaimer, the term of this patent is extended or adjusted under 35 U.S.C. 154(b) by 763 days.

(21) Appl. No.: 18/197,122

(22) Filed: May 15, 2023

(65) Prior Publication Data

US 2023/0283093 A1 Sep. 7, 2023

Related U.S. Application Data

(63) Continuation of application No. PCT/IB2022/053628, filed on Apr. 19, 2022.

(30) Foreign Application Priority Data

Apr. 16, 2021 (HK) ........................... 32021029501.2

(51) Int. Cl.

*H02J 7/00* (2026.01)
*H02J 7/70* (2026.01)
*H05K 5/02* (2006.01)

(52) U.S. Cl.

CPC ............ *H02J 7/751* (2026.01); *H05K 5/0217* (2013.01)

(58) Field of Classification Search

None

See application file for complete search history.

(56) References Cited

U.S. PATENT DOCUMENTS

| | | | | |
|---|---|---|---|---|
| 5,192,904 A | 3/1993 | Leiserson | | |
| 8,513,914 B2 | 8/2013 | Tan et al. | | |
| 2004/0130289 A1 * | 7/2004 | Lam | H02J 7/50 | 320/107 |
| 2006/0109610 A1 * | 5/2006 | Liu | H02J 7/751 | 361/600 |

FOREIGN PATENT DOCUMENTS

| | | |
|---|---|---|
| CN | 1838688 A | 9/2006 |
| CN | 201360029 Y | 12/2009 |
| CN | 101909092 A | 12/2010 |
| CN | 101030985 B | 1/2013 |
| CN | 211860517 U | 11/2020 |
| JP | 2000285890 A | 10/2000 |
| JP | 2009131090 A | 6/2009 |
| JP | 2011041351 A | 2/2011 |

OTHER PUBLICATIONS

European Search Report of European Patent Application No. 22787759.4 issued on Nov. 13, 2024.

* cited by examiner

*Primary Examiner* — Arun C Williams

(57) ABSTRACT

An electrical apparatus comprising a first housing portion and a second housing portion, a first set of battery contacts and a second set of battery contacts, when the second housing portion is at a first relative position, the second set of battery contacts is at an actuation position; and when the second housing portion is at a second relative position, the second set of battery contacts is at a non-actuation position.

20 Claims, 9 Drawing Sheets

ELECTRICAL APPARATUSES

CROSS REFERENCE TO RELATED APPLICATIONS

The present application is a Continuation Application of PCT Application No. PCT/IB2022/053628 filed on Apr. 19, 2022, which claims the benefit of Hong Kong Patent Application No. 32021029501.2 filed on Apr. 16, 2021. All the above are hereby incorporated by reference in their entirety.

FIELD

The present disclosure relates to electrical apparatuses, and more particularly electrical apparatuses comprising a battery receptacle, for example, battery chargers.

BACKGROUND

An electrical apparatus may be set into different operation states. For example, an electrical apparatus may be set into an actuation state or a non-actuation state. When the apparatus is in the actuation state, the apparatus is ready to operate in a predetermined manner. When in the non-actuation state, the apparatus is not ready to operate in the predetermined manner. Improved mechanisms to configure an electrical apparatus from a non-actuation state to an actuation state and vice versa are beneficial.

Many electrical apparatuses comprise a battery receptacle which is configured for releasable reception of batteries so that a battery can be inserted into or removed from the battery receptacle without the aid of a tool. The electrical apparatuses may be a stored power source such as a power bank, a battery charger or other apparatuses configured to operate with batteries.

It is desirable that the battery receptacles of electrical apparatuses are operable between an actuation configuration and a non-actuation configuration while batteries are received inside the battery receptacle by a more force efficient mechanical arrangement.

DISCLOSURE

An electrical apparatus comprising a main housing and electronic and/or electrical circuitries housed inside the main housing is disclosed. The main housing comprises a first housing portion and a second housing portion, the second housing portion being movable relative to the first housing portion in a first direction between a first relative position and a second relative position. A movable portion is received inside the first housing portion. The movable portion is movable in the first direction relative to the main housing between a non-actuation position and an actuation position. The apparatus comprises a wedge mechanism which is configured to move the movable portion from the non-actuation position to the actuation position in an actuation direction which is parallel to the first direction. The second housing portion comprises a driving portion which is configured to operate the wedge mechanism to move the movable portion from the non-actuation position to the actuation position when the second housing portion moves from the second relative position to the first relative position.

The wedge mechanism may comprise wedging components which are distributed on the first housing portion and the second housing portion, and wherein the wedging components on the first housing portion and the second housing portion are configured to cooperate so that movement of the second housing portion relative to the first housing portion along the actuation direction is to bring about the movement of the movable portion in the actuation direction.

The main housing comprises a battery compartment and the circuitries comprise a first set of contact terminals and a second set of contact terminals which cooperate with the battery compartment to define a battery receptacle. The second housing portion may be configured as a sliding roof which is operable to open or close the battery compartment. The second housing portion may be palm-sized and configured for palm-grip operation by a user.

FIGURES

The disclosure is made by way of example with reference to the accompanying figures, in which.

Figure 10A:
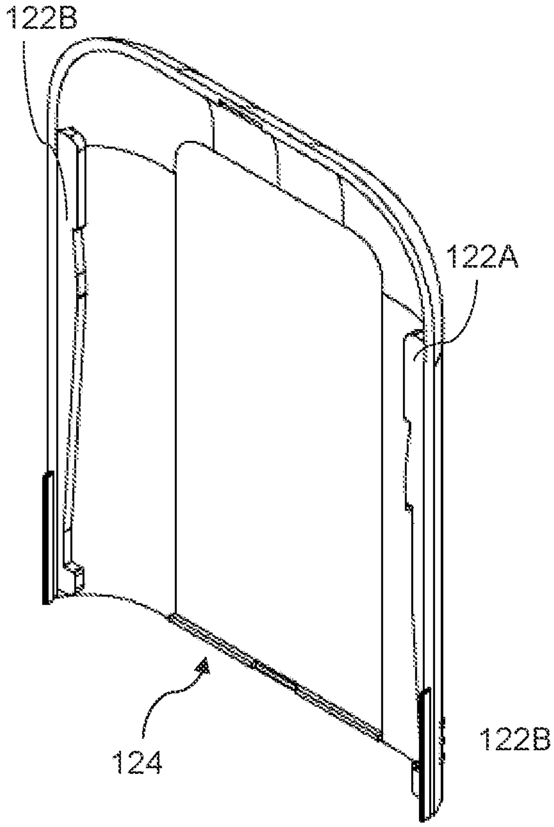
Figure 10B:
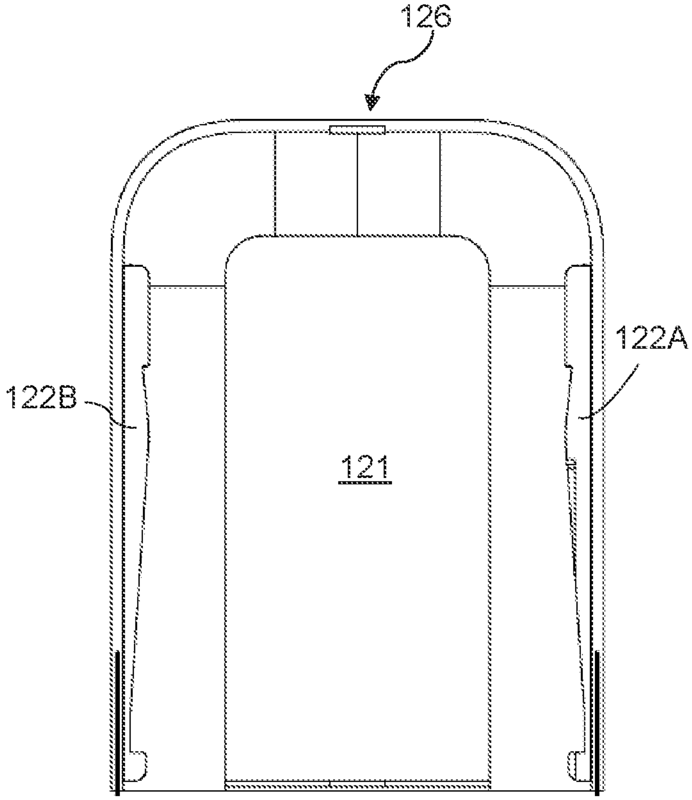
Figure 10C:
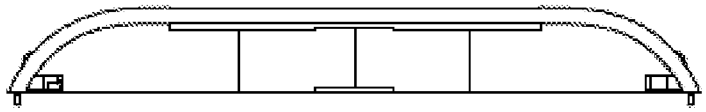
Figure 11A:
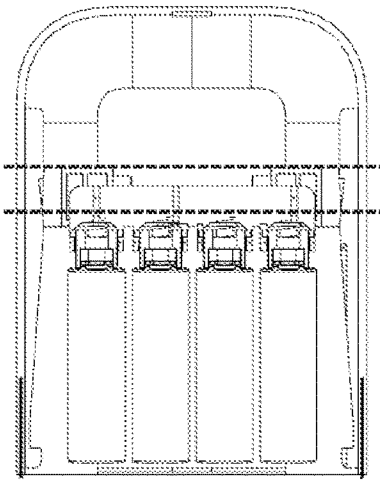
Figure 11B:
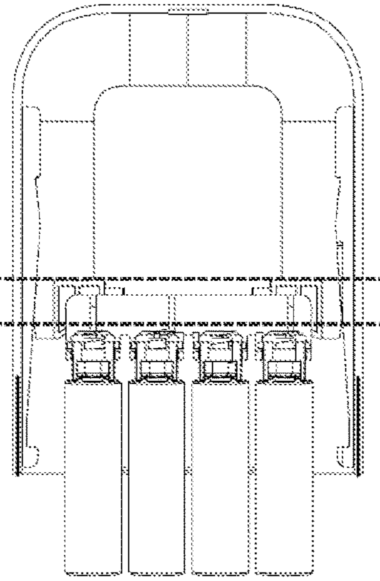
Figure 11C:
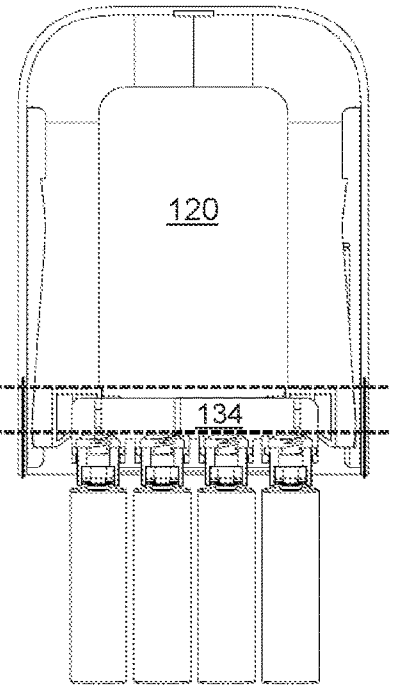

FIGS. 10A, 10B, and 10C are, respectively, bottom perspective view, bottom elevation view and front view of the second housing portion 120, and FIGS. 11A, 11B and 11C are schematic diagrams showing the main housing in the first configuration, in an intermediate configuration, and in the second configuration, respectively.

DESCRIPTION

An apparatus of the present disclosure comprises a main housing and circuitries disposed inside the main housing. The circuitries may comprise electrical circuitries and/or electronic circuitries. The circuitries comprise components which may include electrical, electronic and/or mechanical components. The electronic components may comprise discrete and/or integrated circuit components. The circuitries may be activatable by a switch or a plurality of switches in cooperation with a movable assembly, or by the movement assembly alone. A switch herein may be a mechanical switch, an electromechanical switch or a semiconductor electronic switch.

The movement assembly is part of an actuation mechanism which is configured to actuate or de-actuate the apparatus. When the apparatus is actuated, the apparatus is in its operational state and the circuitries or a selected portion thereof are to perform its designated function(s). When the apparatus is non-actuated or de-actuated, the apparatus is in its non-operational state and the circuitries or a selected portion thereof would not perform its designated function(s).

The movement assembly is configured such that when the movement assembly is in a first state, the apparatus is in its non-actuation state and not actuated, and when the movement assembly is in a second state, the apparatus is in its actuation state and actuated.

The movement assembly comprises a movable member which is movable relative to the main housing between a first position and a second position. When the movement assembly is in the first state, the movable member is at the first position which is an actuation position. When the movement assembly is in the second state, the movable member is at the second position which is a non-actuation position.

The movement assembly or the movable member may be configured to bring the apparatus into the actuation state by mechanical operations of the movement assembly. For example, the movement assembly may be configured to move a set of circuitry component into an operational position whereby the apparatus is actuated and to move the set of circuitry component away from the operational position whereby the apparatus is de-actuated.

The movement assembly or the movable member may be configured to bring the apparatus into the actuation state by non-mechanical operations. For example, the apparatus may comprise a sensing and decision circuit which is configured to detect and determine the position of the movement assembly or the movable member relative to the main housing. For example, when the movement assembly or the movable member is in a relative position corresponding to the actuation position, the sensing and decision circuit may generate an actuation signal to bring the apparatus into the actuation state. On the other hand, when the movement assembly or the movable member is out of the actuation position or at a deactivation position, the sensing and decision circuit may generate a de-actuation signal and the apparatus is de-actuated as a result. The sensing and decision circuit may comprise a set of optical sensors for detecting the position of the movement assembly or the movable member. The set of optical sensors may be configured to facilitate determination of whether the movable member is at the first position, at the second position, or at an intermediate position which is between the first position and the second position. Of course, mechanical and non-mechanical actuation may be deployed in combination without loss of generality.

The main housing comprises a first housing portion and a second housing portion which is movable relative to the first housing portion between a first relative position corresponding to an actuation position and a second relative position corresponding to a non-actuation position. The relative movement between the first housing portion and the second housing portion is along a predetermined path which is determined by mechanical structures of the first housing portion and the second housing portion.

The movement assembly may comprise mechanical parts and/or components which are distributed on the first housing portion and the second housing portion so that relative movements between the first housing portion and the second housing portion along the predetermined path would bring the apparatus into or out of the actuation state.

The apparatus comprises a wedge arrangement which is configured to move the movable member in an actuation direction from the non-actuation position to the actuation position. The wedge arrangement is part of the movement assembly and is configured to assert an engagement force in the actuation direction while in the actuation position. The engagement force is significantly larger than the actuation force which is required to bring the movable member into the actuation position from the non-actuation position. The term significantly larger herein means at least 50% more, and may be 75%, 100%, 150%, 200% or more.

The wedge arrangement comprises a wedging mechanism which is configured to provide a high mechanical advantage so that a user can apply a small force on the main housing at the upstream end whereby the movable member is brought into the actuation position while the movable member at the actuation position at the downstream end can exert an engagement force in the actuation direction which is significantly higher than the actuation force.

The first housing portion and the second housing portion are movable relative to each other along an axial direction which is parallel to the actuation direction. The axial direction is defined by a main axis of the main housing and the axial direction defines a movement direction of the first housing portion relative to the second housing portion or of the second housing portion relative to the first housing portion. To facilitate wedging operation of the wedging mechanism when the movement direction and the actuation direction which are the same or parallel, the movable member which is part of the wedging mechanism is configured to move at an angle to the actuation direction or the movement direction, and the angle is at 90 degrees or less.

Referring to FIGS. 1A, 1B, 2A, 2B, 3A, 3B, 3C, 4A, 4B and 4C, an example apparatus 100 comprises a first housing portion 110 and a second housing portion 120 which cooperate to define a main housing. The main housing has a reference axis which is referred to as a main axis A-A'. The main axis is also a longitudinal centre axis of the main housing. The first housing portion 110 and the second housing portion 120 are relatively movable along a movement direction which is defined by a movement axis that is parallel to the main axis.

The example apparatus 100 comprises a circuitry compartment inside which circuitries of the apparatus are contained and a battery compartment which includes a battery receptacle. The circuitry compartment and the battery compartment are disposed along the axial direction of the main axis and are in abutment. The battery receptacle is configured for receiving a set of batteries. A set of batteries herein may comprise a single battery unit or a plurality of battery units. Each battery unit B may comprise a single battery cell or a plurality of battery cells arranged into a battery pack. Each battery pack may comprise one battery cell or a plurality of battery cells packed within a single package.

Figure 4A:
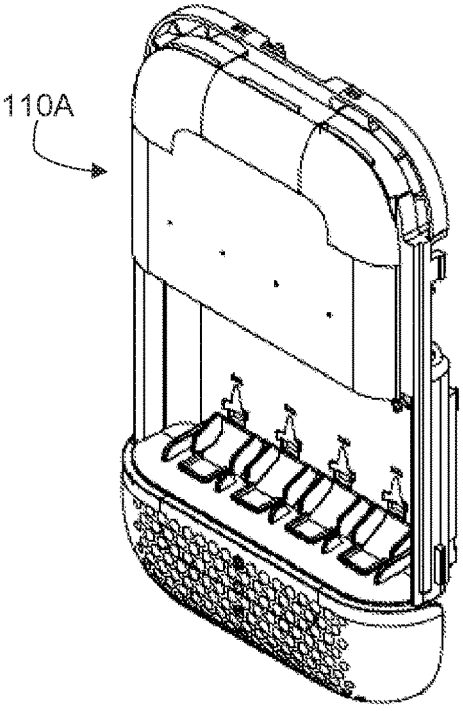
FIG. 4A is a top perspective view showing the upper portion of the first housing portion 110.
Figure 4B:
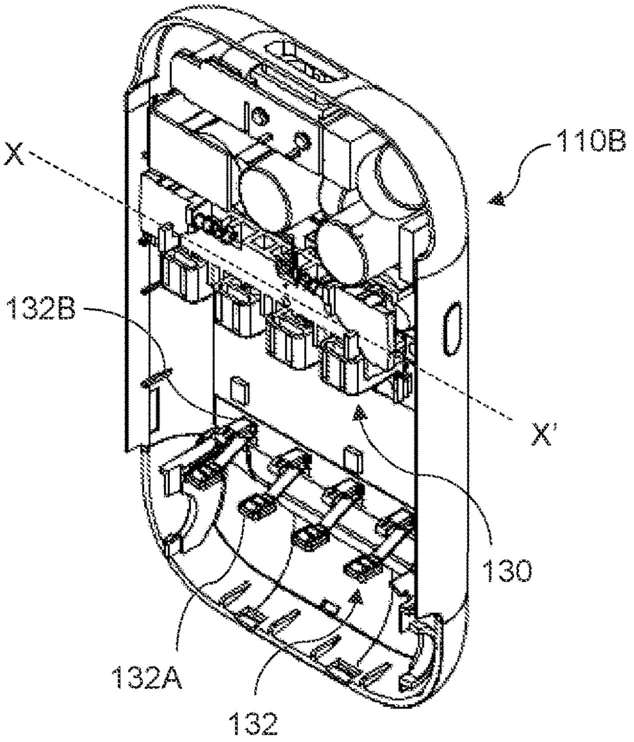
FIGS. 4B and 4C are, respectively, a top perspective view and a top elevation view exposing circuitries and components received inside the lower portion of the first housing portion 110.
Figure 4C:
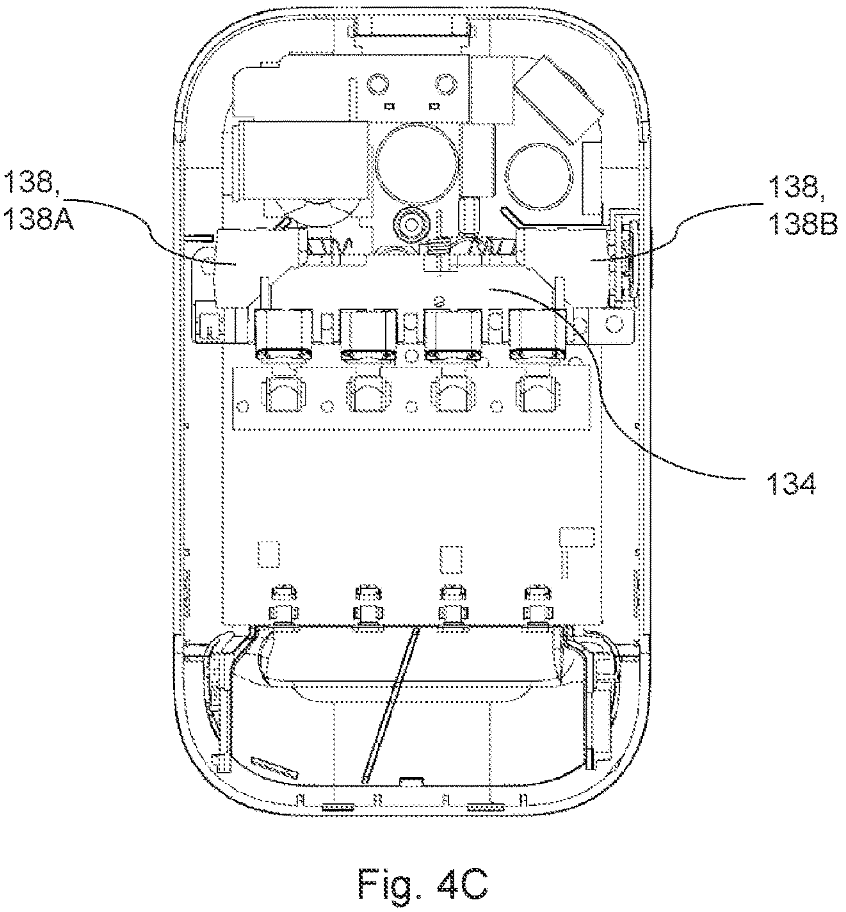

The circuitry compartment and the battery compartment are devised on the first housing portion 110, as shown in FIGS. 4A to 4C, and the second housing portion 120 is configured as a lid which is movable relative to the first housing portion 110 between a first position corresponding to a closed position of the battery compartment and a second position corresponding to an open position of the battery compartment, as shown in FIGS. 1A, 1B, 2A and 2B. The first housing portion 110 and the second housing portion 120 are in slide engagement and the second housing portion 120 is slidable relative to the first housing portion 110 in a slide direction between the first position and the second position. The slide direction is defined by a slide axis Y-Y' and the slide axis Y-Y' is parallel to the main axis A-A' of the main housing.

The circuitry compartment and the battery compartment are in abutment and are devised on the first housing portion 110. The example first housing portion 110 comprises a first sub-portion which is an upper portion 110A and a second sub-portion which is a lower portion 110B. The upper portion 110A and the lower portion 110B are connected in a connection direction which is orthogonal to the slide axis Y-Y'.

The lower portion 110B comprises a bottom portion having a bottom surface which faces the upper portion 110A and a lower peripheral wall which surround the bottom surface. The bottom portion and the lower peripheral wall cooperate to define a lower portion of a main compartment inside which circuitries of the apparatus are installed.

The upper portion 110A comprises a first portion which cooperates with the lower portion 110B to form the circuitry compartment, and a second portion which defines the battery compartment.

The first portion of the upper portion 110A comprises a top panel and a first peripheral wall which is downwardly dependent from the top panel and surrounds the top panel.

The second portion of the upper portion 110A comprises a bottom panel and a second peripheral wall which is upwardly dependent from the bottom panel having a bottom surface and which surrounds the bottom surface of the bottom panel. The second peripheral wall comprises a first peripheral wall portion which is proximal to the circuitry compartment and a second peripheral wall portion which is distal from the circuitry compartment.

The bottom panel and the second peripheral wall cooperate to define the battery receptacle, and the top panel is elevated above the bottom panel and the first and second peripheral walls, and preferably above the batteries held by the battery receptacle.

The circuitries of the apparatus comprise a plurality of battery contact terminals which is configured to connect the set of battery units on the battery receptacle with other parts of the circuitries. The plurality of battery contact terminals cooperates with the battery compartment to define a battery receptacle and is configured for making contact, electrical and mechanical, with a set of battery units which is duly placed on the battery receptacle. The battery contact terminals are exposed contact terminals which are configured for making releasable compressive contact with terminals of the set of batteries which is on the battery receptacle when the battery is in an operational state. A battery in the releasable compressive contact state can be removed from the battery receptacle without a tool.

The contact terminals comprise a first set of contact terminals of a first electrical polarity and a second set of contact terminals of a second electrical polarity opposite to the first electrical polarity. A set of contact terminals of an electrical polarity may comprise one contact terminal or a plurality of contact terminals of that electrical polarity.

The plurality of contact terminals may be distributed on one axial side or on opposite axial sides of the battery compartment. Where the contact terminals are distributed on opposite axial sides of the battery compartment, the contact terminals are arranged in pairs and each pair of contact terminals comprises a contact terminal of a first polarity on one axial side and a contact terminal of a second polarity on another axial side, such that a contact terminal of a first polarity on one axial side and a contact terminal of a second polarity on another axial side are axially aligned with the axis of a target battery unit and separated by an axial separation distance required for making good electrical contact with the target battery unit.

The example apparatus 100 comprises a first set of contact terminals 130 which is disposed on a first axial end of the battery receptacle and a second set of contact terminals 132 which is disposed on a second axial end of the battery receptacle. The first axial end of the battery receptacle is proximal to the circuitry compartment and the second axial end of the battery receptacle is distal to the circuitry compartment. The first and the second sets of battery terminals have corresponding contact terminals which are axially aligned. The battery compartment has a first axial end which is proximal to the first axial end of the battery receptacle and a second axial end which is proximal to the second axial end of the battery receptacle.

The first set of contact terminals 130 and the second set of contact terminals 132 are relatively movable in the axial direction so that the axial distance between the first and second set of contact terminals can be varied between a first separation distance and a second separation distance. When the first set of contact terminals 130 and the second set of contact terminals 132 are in the first separation distance, a target battery received on the battery receptacle is in no or poor electrical contact with the contact terminals configured for making contact with that battery unit. When the first set of contact terminals 130 and the second set of contact terminals 132 are in the second separation distance, a target battery received on the battery receptacle is in good electrical contact with the contact terminals configured for making contact with that battery unit.

The first set of contact terminals 130 is a set of movable contact terminals which is configured to move in the actuation direction to progress towards and enters the actuation position. When the first set of contact terminals 130 is moved into the actuation position, the apparatus is in an actuation state and the terminals of the set of battery in the receptacle are in releasable compressive engagement with the battery receptacle. In this example, the set of movable contact terminals is moved towards the second axial end of the battery compartment and/or the second set of contact terminals 132 when progressing in the actuation direction towards the actuation position.

The set of movable contact terminals is driven towards the actuation position by a movement assembly which comprises a driver member 134. The driver member 134, being a movable member, is a front-end member of the movement assembly and is configured to move in synchronization with the set of movable contact terminals when progressing towards the actuation position.

Figure 8A:
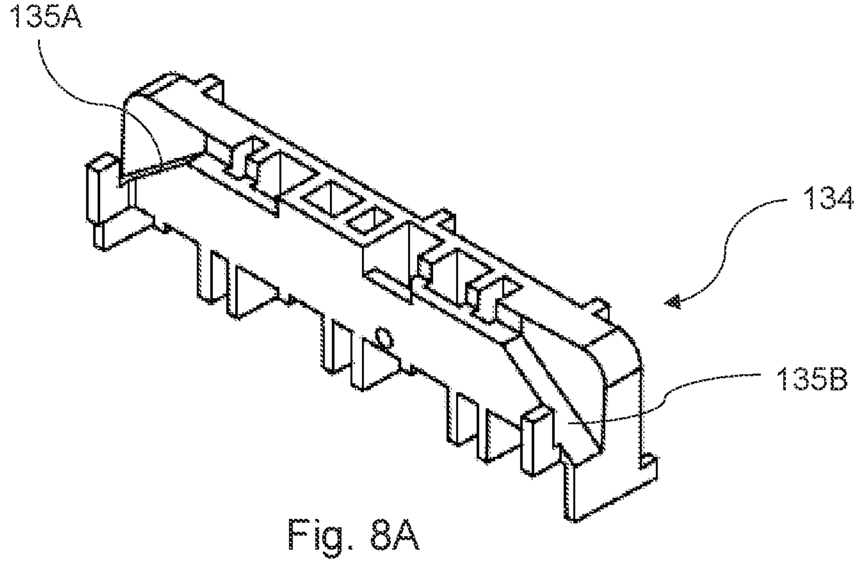
FIGS. 8A and 8B are a perspective view and a top elevation view of the driver member 134 of the movement assembly of FIG. 5A.
Figure 8B:
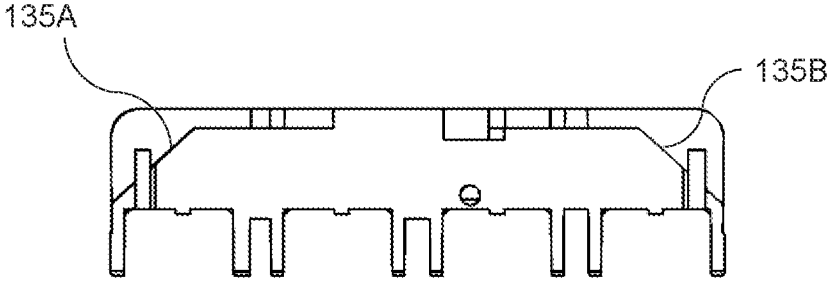

The example driver member 134 comprises a body portion which extends in a transverse direction between a first lateral end and a second lateral end, as shown in more detail in FIG. 8A. The transverse direction is defined by a transverse axis X-X' which is orthogonal to the main axis Y-Y' of the main housing. The main axis Y-Y' defines a longitudinal direction of the main housing. The driver member 134 is in abutment with the first set of terminals 130 so that the first set of terminals 130 is to move in synchronization with the driver member 134 when the driver member 134 is progressing towards the actuation position. The driver member 134 comprises a forward-facing surface which is a surface that is facing the second axial end of the battery compartment, and the first set of terminals 130 is mounted on the forward-facing surface.

When in the actuation position, a target battery unit which is duly received in the battery receptacle will be in compressive contact with a pair of contact terminals configured for making electrical connection therewith. When a target battery is in compressive contact with a corresponding pair of contact terminals, the target battery and the corresponding pair of contact terminals are in good electrical contact and current can flow in or out of the target battery without an unduly high resistance due to the releasable engagement.

Referring to FIGS. 4C, 4D, 4E, 5A, 5B, 7A, 7B, 7C, 8A and 8B, the example movement assembly comprises a pair of driving members 138 which is configured to operate to move the driver member 134 to advance in the actuation direction towards the actuation position. The pair of driving members 138 comprises a first driving member 138A having an inclined surface 138A1 which is in abutment with an inclined first lateral surface 135A of the driver member 134, and a second driving member 138B having an inclined surface 138B1 which is in abutment with an inclined second lateral surface 135B of the driver member 134. The inclined surface of the first driving member 138A and the inclined first lateral surface of the driver member 134 are in slide engagement so that the inclined surface and the inclined first lateral surface are slidable relative to each other. The inclined surfaces of the driving members 138A, 138B may have an angle of inclination of between 30° and 60°, for example, 45° with respect to the main axis of the main housing.

The driving members 138A, 138B and the driver member 134 are arranged such that when the driving members 138A, 138B move towards each other, that is, towards the longitudinal centre axis of the main housing, the driver member 134 will be pushed to move forward towards the actuation position.

Figure 9A:
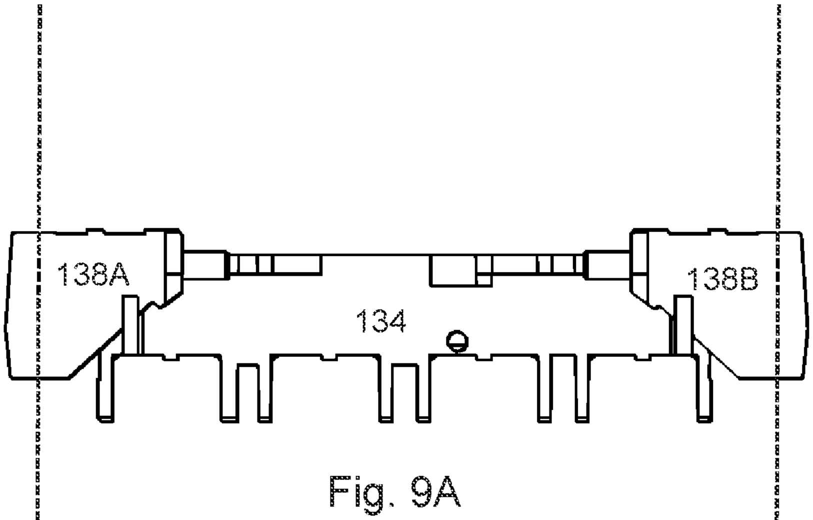
FIGS. 9A and 9B are top plan views showing, respectively, the movement assembly in a non-actuation state and in an actuation configuration.
Figure 9B:
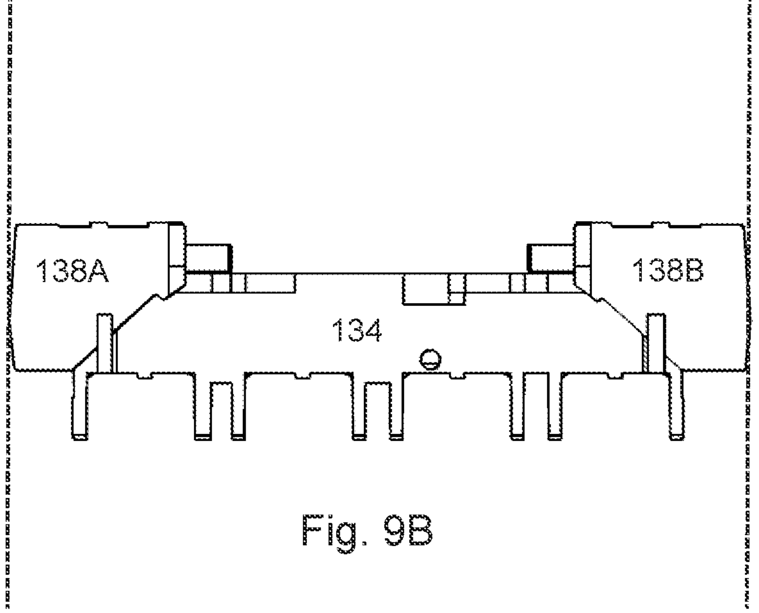

In this example, the driving members 138A, 138B are configured to move in the transverse direction towards each other whereby the driver member 134 is driven to move along the actuation direction which is orthogonal to the transverse direction, as shown in FIGS. 9A and 9B. To facilitate such an orthogonal driving, the inclined surface of the first driving member 138A and the inclined first lateral surface of the driver member 134 have complementary inclination angles.

While the driving members 138A, 138B are configured to move towards each other along the transverse axis X-X' in the present example, the driving members 138A, 138B may be configured to move at an acute angle to the transverse direction while moving towards each other without loss of generality. The acute angle with respect to the transverse direction may be ±5°, ±10° or larger, but would be less than ±60°.

Figure 4D:
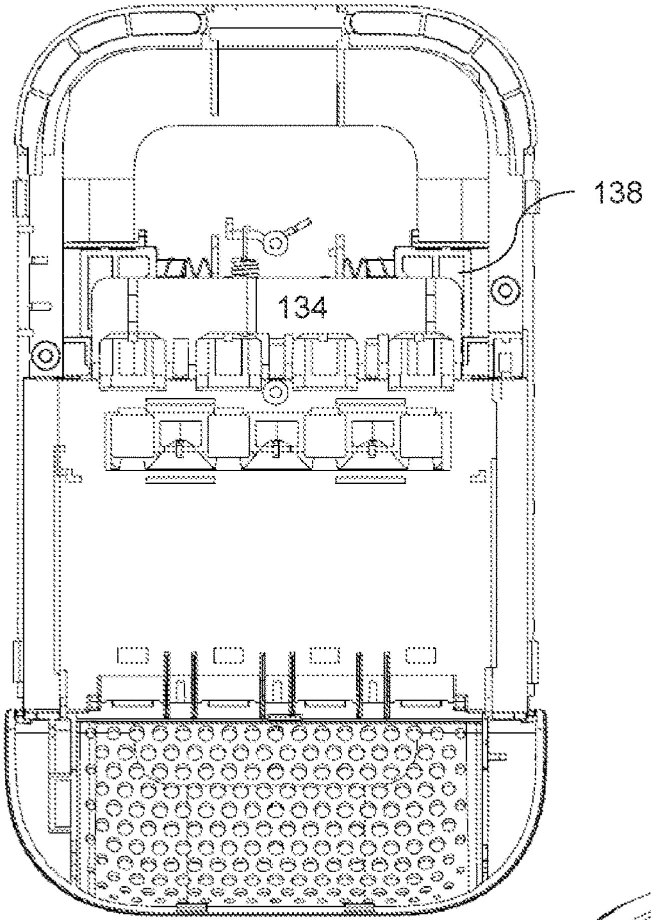
FIGS. 4D and 4E are, respectively, a bottom elevation view and bottom perspective view showing the upper housing portion 110A and the movement assembly.
Figure 4E:
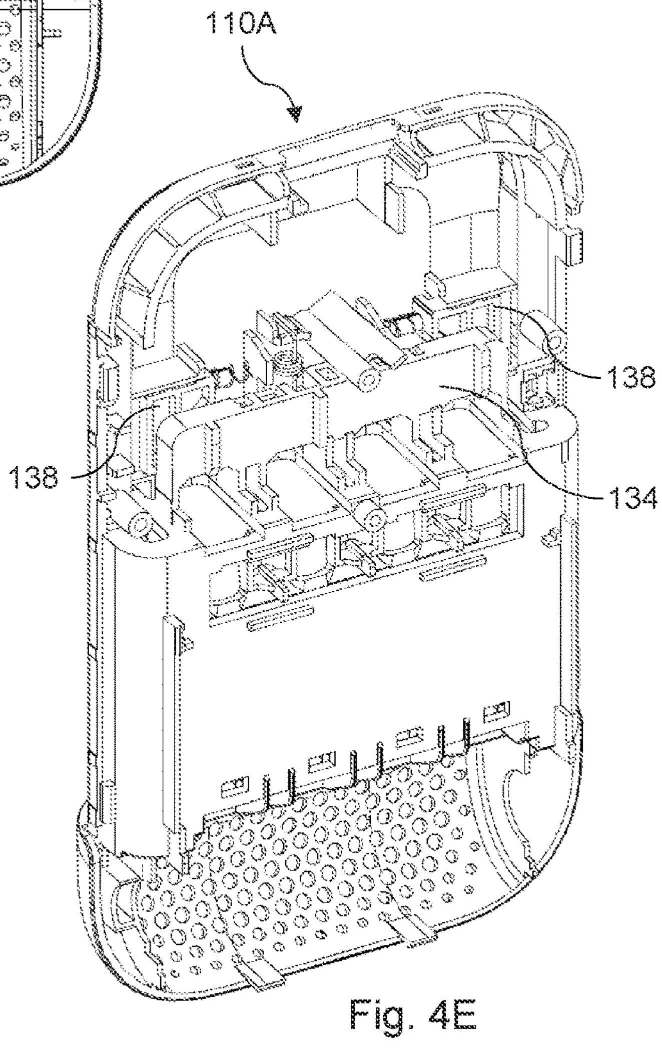
Figure 5A:
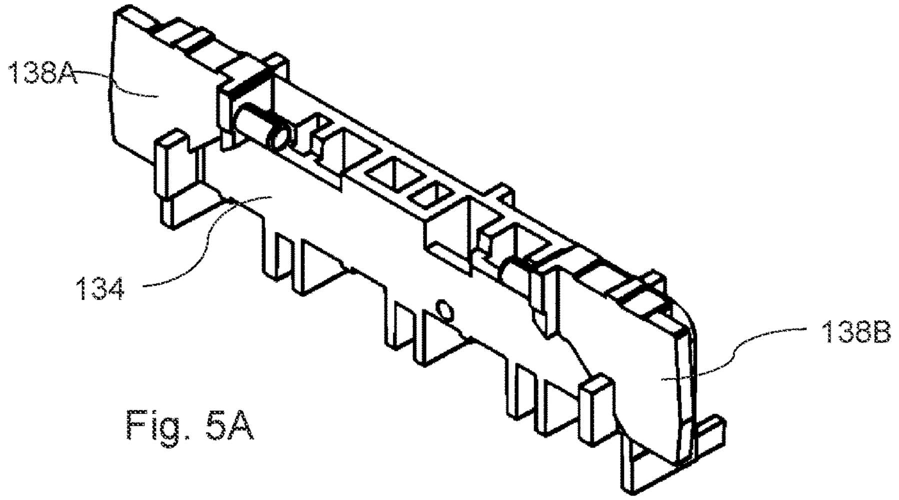
FIGS. 5A and 5B are, respectively, a perspective view and a top elevation view of the movement assembly showing relative position of components when in the actuation position.
Figure 5B:
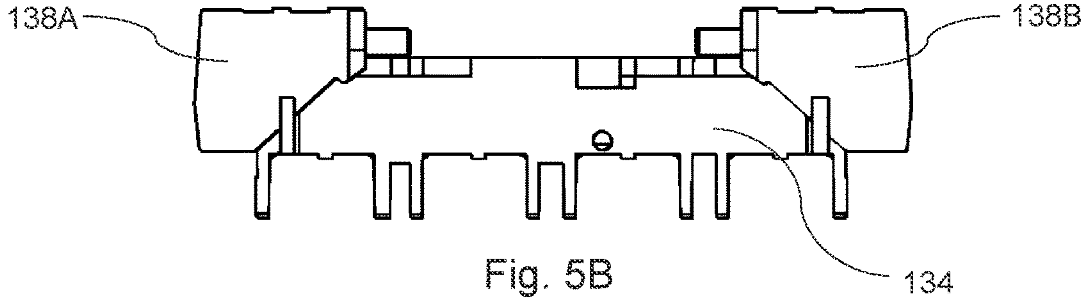
Figure 6A:
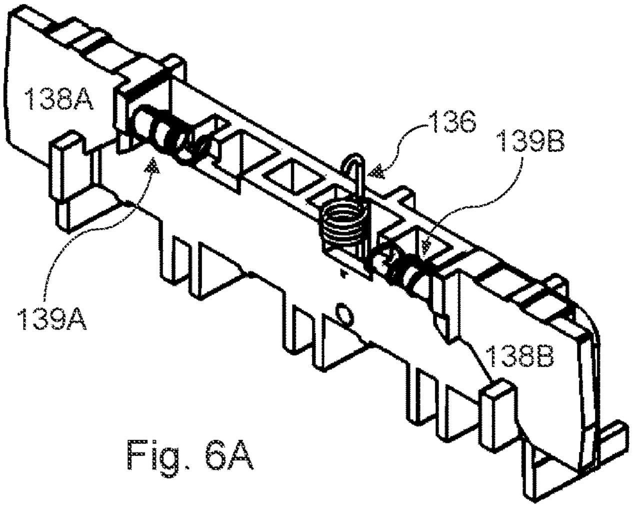
FIGS. 6A and 6B are, respectively, the perspective view and the top elevation view of FIGS. 5A and 5B with biasing springs in place.
Figure 6B:
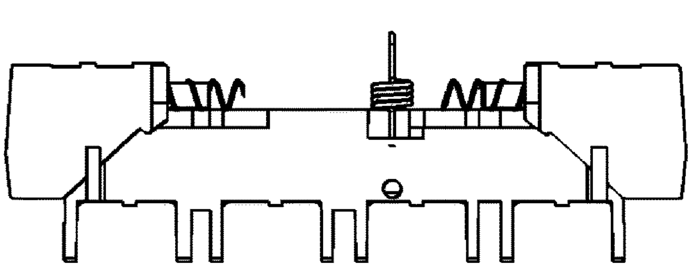
Figure 7A:
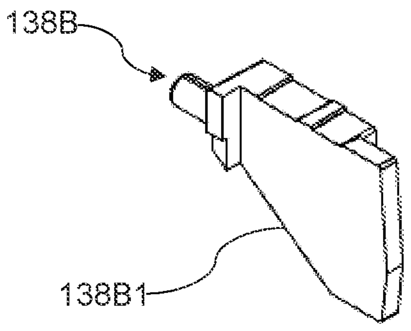
FIGS. 7A and 7B are a perspective view and a top elevation view of the driving member 138B of the movement assembly of FIG. 5A.
Figure 7B:
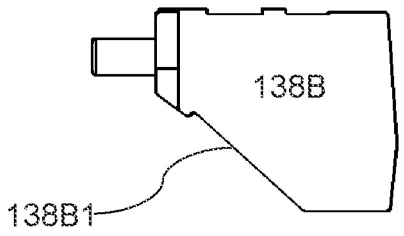
Figure 7C:
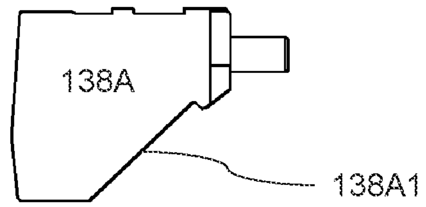
FIG. 7C is a top elevation view of the driving member 138A of the movement assembly of FIG. 5A.

Referring to FIGS. 6A and 6B, the driving members 138A, 138B are under a return bias which is configured to move the driving members 138A, 138B away from each other, and the driver member 134 is under a return bias which is configured to move the driver member 134 away from the actuation position. The return biases acting on the driving members 138A, 138B are provided by biasing springs 139A, 139B and the return bias acting on the driver member 134 is provided by another biasing spring 136. The biasing springs are coil springs which are anchored on the main housing, as shown in FIGS. 4D and 4E.

Therefore, in order to move the driver member 134 to progress through to the actuation position from the non-actuation position, it would be necessary to overcome the return biases which are acting on the driver member 134 and the driving members 138A, 138B, which are contained inside the circuitry compartment.

Figure 1A:
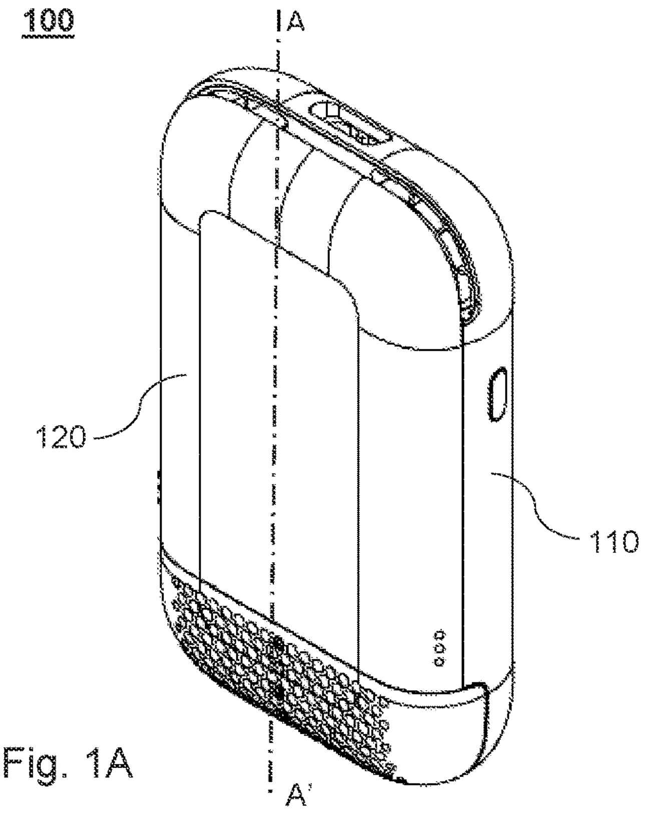
FIGS. 1A and 2A are, respectively, perspective views of an example electrical apparatus of the present disclosure in a first configuration and a second configuration.
Figure 1B:
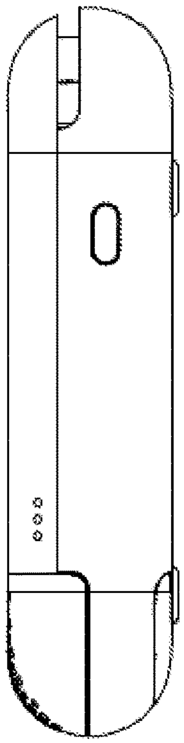
FIGS. 1B and 2B are, respectively, side elevation views of FIGS. 1A and 2A.
Figure 2A:
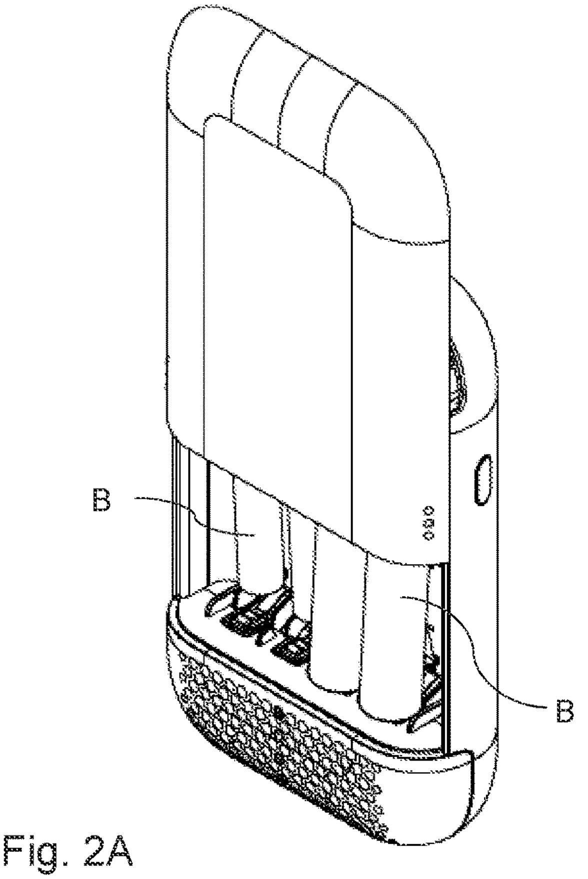
Figure 2B:
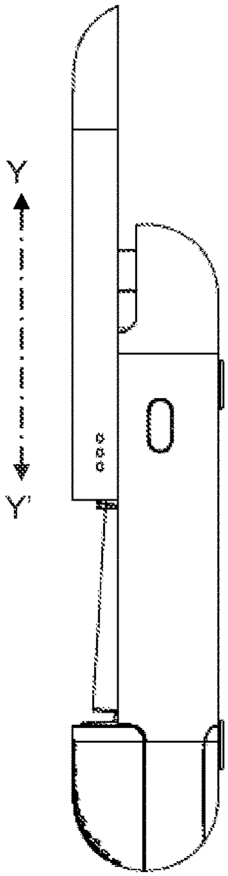
Figure 3A:
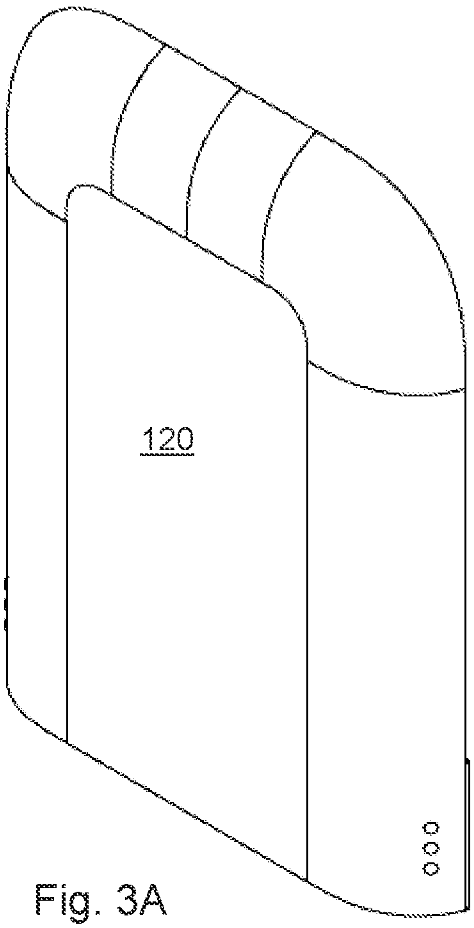
FIG. 3A is a top perspective view of the second housing portion of the example apparatus of FIGS. 1A and 2A.
Figure 3B:
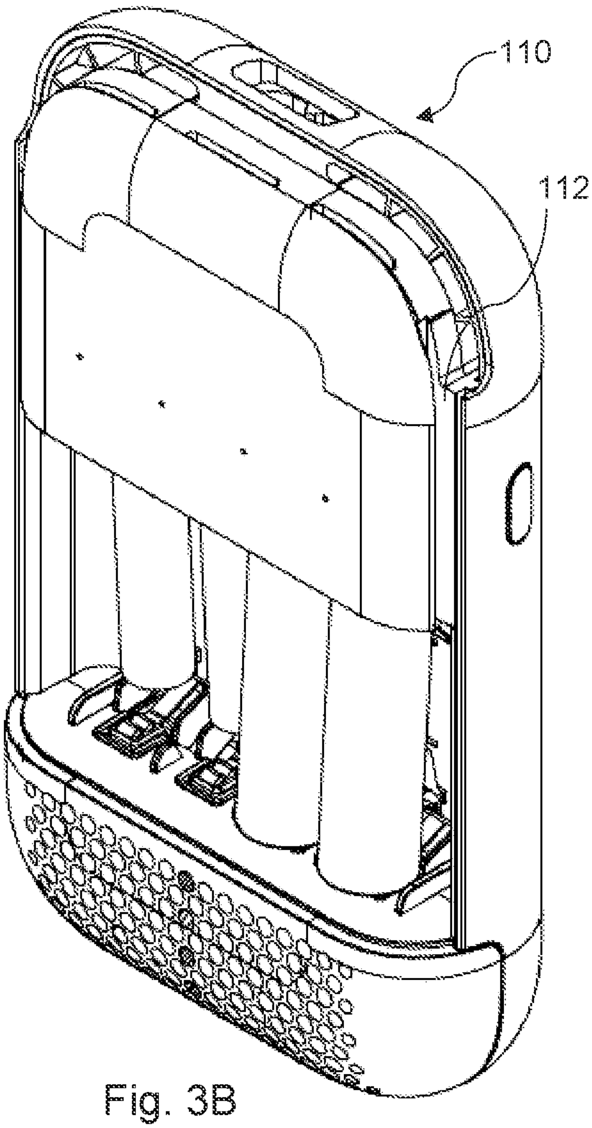
FIGS. 3B and 3C are, respectively, a top perspective view and a side elevation view of the first housing portion 110 of the apparatus of FIGS. 1A and 1B, with a plurality of battery units releasably received inside the battery receptacle.
Figure 3C:
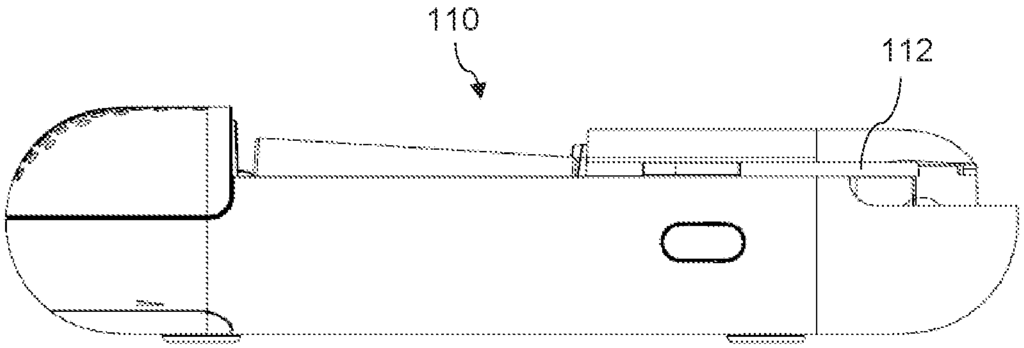

Referring to FIGS. 1A to 2B, the second housing portion 120 is slidably movable relative to the first housing portion 110 between a first relative position, as shown in FIGS. 1A and 1B, and a second relative position, as shown in FIGS. 2A and 2B. To facilitate relative sliding movement between the first housing portion 110 and the second housing portion 120 while in abutment, the first housing portion 110 comprises a track portion 112 and the second housing portion 120 comprises an attachment portion which is configured to cooperate with the track portion 112 so that the first housing portion 110 and the second housing portion 120 are relatively slidable along a sliding direction.

When the first housing portion 110 and the second housing portion 120 are in the first relative position, the main housing is in a first configuration which is an actuation configuration, the battery receptacle is in a first state which is an actuation state, and the apparatus is in an operational state with the battery unit(s) duly connected to the circuitries.

When the first housing portion 110 and the second housing portion 120 are in the second relative position, the main housing is in a second configuration which is a non-actuation configuration, the battery receptacle is in a second state which is a non-actuation state, and the apparatus is in a non-operational state with the battery unit(s) electrically disconnected from the circuitries.

In this example, the main housing is configured such that the first housing portion 110 and the second housing portion 120 are relatively slidable along a sliding direction which is parallel to an axial direction defined by the main axis. When the main housing is in the first configuration, the battery compartment is in a first state which is a closed state and the second housing portion 120 forms a roof which closes the battery compartment, as shown in FIGS. 1A and 1B. When the main housing is in the second configuration, the battery compartment is in a second state which is an open state, and the battery compartment is open for external access and battery units can be inserted into or removed from the battery receptacle, as shown in FIGS. 2A and 2B.

The second housing portion 120 comprises a top portion, a peripheral portion which extends downwardly from the top portion, and an attachment portion formed on the peripheral portion. The top portion comprises a top panel 121 which is to form the roof of the battery compartment when the main housing is in the first configuration. The peripheral portion comprises a first lateral portion and a second lateral portion, and the top portion is intermediate the first lateral portion and a second lateral portion. Each lateral portion comprises a lateral wall portion which projects downwardly from the top panel and extends to below and cover the track portion 112.

The attachment portion is formed near the downward end of the peripheral portion and comprises first wing portion 122A and a second wing portion 122B. The first wing portion 122A is formed on the first lateral portion and the second wing portion 122B is formed on the second lateral portion. Each wing portion 122A, 122B is a lateral wing portion which extends in a direction parallel to the axial direction and which projects inwardly towards the interior of the first housing portion 110 to enter into slide engagement with the track portion 112.

The second housing portion 120 has a first longitudinal end 124 and a second longitudinal end 126 and the lateral wing portions extend between the first longitudinal end and the second longitudinal end. The first longitudinal end of the second housing portion 110 is always on the first housing portion 110 while the second longitudinal end is outside or overhangs the first housing portion 110 when the main housing is in the second configuration.

The lateral wing portion extends in the longitudinal direction and has a width profile which is characteristic of a sawtooth. The width of the lateral wing portion is the extent of inward projection, measured in a direction orthogonal to the z axis, which is an axis orthogonal to both the X-X' axis and the Y-Y' axis.

The lateral wing portion comprise a first flank portion, a second flank portion and a crest which interconnects the first flank portion and the second flank portion.

The first flank portion tapers on extending from the crest to the first longitudinal end and tapers on extending from the crest to the second longitudinal end.

The lateral wing portions are configured as a driving portion for driving the movement assembly.

Referring to FIG. 11A, the main housing is in the first configuration, the movement assembly is in a first state, and the apparatus are in an actuation state.

Referring to FIG. 11B, the main housing is in an intermediate configuration, the movement assembly is in an intermediate state, and the apparatus is in the non-actuation state.

Referring to FIG. 11C, the main housing is in the second configuration, the movement assembly is in a second state, and the apparatus are in a non-actuation state.

When in the first configuration of FIG. 11A, the pair of driving members 138 is in compressive engagement with the second flank portions of the lateral wing portions of the second housing portion 120, and the movable member 134 is in the actuation position due to a resulting actuation force which acts on the movable member 134 by the pair of driving members 138. The actuation force is applied by the pair of driving members 138 on the movable member 134 through the inclined surfaces 138A1, 138B1 which are wedging surfaces. The wedging surfaces on the pair of driving members 138 cooperate with the corresponding wedging surfaces 135A, 135B of the movable member 134 to generate an actuation force in the actuation direction.

When a user is to change the main housing from the first configuration of FIG. 1 (including FIGS. 1A and 1B) to the second configuration of FIG. 2 (including FIGS. 2A and 2B), the user is to move the second housing portion 120 in the de-actuation direction Y'→Y relative to the first housing portion 110 and the de-actuation movement will stop when the second housing portion 120 is stopped by a stop means on the first housing portion 110. When the second housing portion 120 is moved in the de-actuation direction so that the crests on the lateral wing portions have overcome a retention means on the driving members 138, the returning energy stored in the biasing springs will move the second housing portion 120 to the second configuration without the aid of the user. When in the second configuration, the biasing energy stored in the biasing springs of the movable member 134 and the pair of driving members 138 are released or substantially released.

To change from the second configuration to the first configuration, the main housing will have to go through the intermediate configuration of FIG. 11B. When in the intermediate configuration, the first flank portions of the lateral wing portions of the second housing portion 120 and the pair of driving members 138 are in abutment.

When changing from the intermediate configuration to the first configuration, movement of the second housing portion 120 in the actuation direction relative to the first housing portion 110 will cause the driving members 138A, 138B to move towards each other along a predefined track which is formed on the first housing portion 110 due to cooperation between the inclined surfaces on the lateral wing portions of the second housing portion 120 and the pair of driving members 138. The predefined track is at a right angle to the longitudinal axis in this example, but can be an acute angle, for example, of between 45 and 90 degrees.

Movement of the driving members 138A, 138B towards each other is then translated into an actuation force in the actuation due to cooperation of the inclined surfaces on the movable member 134 and the inclined surface on the driving members 138A, 138B which are in slide engagement with the inclined surfaces on the movable member 134. When the second housing portion 120 is moved from non-actuation position towards the actuation position and reach a position where the second flank portions are in abutment contact with the driving members 138A, 138B, the second housing portion 120 will be retained by the crests in cooperation with the retention means devised on the driving members 138A, 138B. To move the second housing portion 120 out of the actuation position, a user will have to move the second housing portion 120 in the de-actuation direction, which is opposite to the actuation direction, to overcome the retention force.

Therefore, the movement assembly comprises movement components which are configured to drive the movable set of contact terminals from the non-actuation position to the actuation position. The movement components are distributed on both the first housing portion and the second housing portion, and comprise:

- a first wedging portion on the second housing portion which is formed by the first flank portions of the lateral wing portions,
- a second wedging portion which is formed on the driving members 138A, 138B, and
- an optional third wedging portion which is formed on the driver member 134.

The wedging portions cooperate to drive the driver member 134 to move in the actuation direction by wedging operations.

The first flank portion is configured to have a small inclination angle with respect to the main axis to provide a higher mechanical advantage to drive the driving members 138A, 138B. The inclination angle, which defines a wedging angle of the first flank portion, may be 15 degrees or smaller, for example between 3 degrees and 15 degrees, including 3, 4, 5, 6, 7, 8, 9, 10, 11, 12, 13, 14, 15 degrees or a range or ranges formed by a combination of the aforesaid values. The small inclination angle will result in a mechanical advantage of larger than 1, for example, 2, 3, 4, 5, 6, 7, 8, 9, 10, 12, 14, 15, 20, 25, etc. or a range or ranges formed by a combination of the aforesaid values. In order that the driver member 134 will move through a sufficient distance in the actuation distance to provide a sufficient engagement tension, the first flank portion may have a length, measured in the axial direction, of 3 cm or more, for example, 3, 4, 5, 6, 7, 8, 9, 10, 11, 12, 13, 14, 15 cm or a range or ranges formed by a combination of the aforesaid values.

The example apparatus is configured as a battery charger and the circuitries are configured for battery charging. In order to provide good electrical contact between a battery unit and the corresponding terminals, the battery receptacle is configured to apply an engagement tension which is sufficient to establish good electrical contact. In example embodiments, the engagement tension is set to be 1.0 Kg force or higher, for example, 1.6 Kg force, 1.7 Kg force, 1.8 Kg force etc. The engagement tension is provided by the wedging operation of the movement assembly without loss of generality.

Consumer products often use standard-sized battery cells for easy placement and replacement by users. Used battery cells are put inside a battery charger for recharging. A battery receptacle is a battery holder which is configured to secure battery unit in place while power is delivered from the charger to the battery units. A battery receptacle is often provided with a soldered lug and a metal spring or a lever for electrical connection with terminals of a battery cell. As the user inserts one end (usually the negative end) of the battery cell, the spring or the lever is pressed down. The battery cell slides into the battery holder, and the other end (usually the positive end) of the battery cell is snapped into place. The present mechanism provides an improved battery receptacle and an improved battery charger.

The example battery receptacle is configured for receiving batteries of different sizes. For example, the example battery receptacle comprises an example plurality of four battery slots and an AA-sized or an AAA-sized battery can be received in each battery slot. Each battery slot has terminal contacts configured for making electrical and mechanical contact with a battery of a first size or a second size. For example, the battery slot has contacts 132A for making contact with an AA-sized battery and contacts 132B for making contact with an AAA-sized battery. The distance between the actuation position and the non-actuation position can be very small compared to the length of the receptacle, measured along the longitudinal direction. For example, the distance may be between 0.5 mm and 2 mm, including 0.5, 0.6, 0.7, 0.8, 0.9, 1.0, or any range or ranges selected from the aforesaid values, while the receptacle length may be between 4.5 cm to 5.5 cm for AA- and/or AAA-chargers.

While the example battery charger is for charging battery units, the clamping device of the battery charger may be adapted to be used in other portable tool, like area light, hammer drill. When adapted as a portable tool, power is conveyed from battery cells to the portable tool. Furthermore, while the movement mechanism in the example comprises slidable movers, the movement mechanism may comprise a lever system, for example, a hinged lever system in which the second set of battery contacts are moved in response to hinged movement of the second housing portion relative to the first housing portion.

While the disclosure has been described herein with reference to examples, the examples are not intended and should not be used to limit the scope of disclosure. For example, while the example charger is configured for receiving standard AA- and AAA-sized cylindrical batteries, the charger can be configured to have a receptacle for receiving other cylindrical batteries such as 18650 batteries or non-cylindrical batteries such as prismatic batteries. While the battery contacts are configured for charging batteries having a battery axis and with battery terminals on opposite axial end of the battery, the battery terminals may be on one axial end only without loss of generality. Where the batteries have terminals of opposite polarities on one axial end, the set of movable battery contacts may comprise contacts of opposite polarities.

The invention claimed is:

1. An electrical apparatus comprising a main housing, electronic and/or electrical circuitries housed inside the main housing, and an actuation mechanism which is configured to actuate or de-actuate the apparatus, the actuation mechanism comprising a movement assembly including a movable portion and a wedge mechanism;

wherein the main housing comprises a first housing portion and a second housing portion, the second housing portion being movable relative to the first housing portion in a first direction between a first relative position and a second relative position;

wherein the movable portion is received inside the first housing portion and is movable in the first direction relative to the main housing between a non-actuation position and an actuation position; and wherein the wedge mechanism is configured to move the movable portion from the non-actuation position to the actuation position in an actuation direction is parallel to the first direction;

wherein the second housing portion comprises a driving portion which is configured to operate the wedge mechanism to move the movable portion from the non-actuation position to the actuation position when the second housing portion moves from the second relative position to the first relative position; and wherein when the movable portion is in the actuation position, the apparatus is actuated and the electronic and/or electrical circuitries or part thereof are operational to perform designated functions, and when the movable portion is in the non-actuation position, the apparatus is in a non-actuation or de-actuation state and the electronic and/or electrical circuitries or part thereof are not to perform the designated functions.

2. The apparatus of claim 1, wherein the wedge mechanism comprises wedging components which are distributed on the first housing portion and the second housing portion, and wherein the wedging components on the first housing portion and the second housing portion are configured to cooperate so that movement of the second housing portion relative to the first housing portion along the actuation direction is to bring about the movement of the movable portion in the actuation direction to actuate the electronic and/or electrical circuitries or part thereof.

3. The apparatus of claim 1, wherein the movement assembly is configured to move a set of circuitry components into an operational position whereby the apparatus is actuated and to move the set of circuitry components away from the operational position whereby the apparatus is de-actuated; wherein the wedge mechanism comprises a first wedging portion which is inside the first housing portion, and wherein the first wedging portion comprises a wedging member which is configured to move at an angle to the actuation direction when the second housing portion moves in the actuation direction, the angle being between 60 and 90 degrees, including at 60°, 65°, 70°, 75°, 80°, 85°, 90°, or a range or ranges combined by selection of any of the aforesaid values.

4. The apparatus of claim 3, wherein the first wedging portion comprises a plurality of wedging members including a first wedging member and a second wedging member, and wherein the first wedging member and the second wedging member are configured to move towards each other in response to movement of the second housing portion in the actuation position.

5. The apparatus of claim 4, wherein the first wedging member and the second wedging member are mirror-symmetrically disposed about a longitudinal center axis of the main housing, the longitudinal center axis being parallel to the actuation direction.

6. The apparatus of claim 4, wherein each wedging member comprises a wedging surface which is in abutment with the movable portion, and wherein the wedging surface is an inclined surface which is at an acute inclination angle to the actuation direction, the inclination angle being between 30° and 60°, including at 30°, 40°, 45°, 50°, 60°, or a range or ranges combined by selection of any of the aforesaid values.

7. The apparatus of claim 6, wherein the wedging surfaces of the wedging members are mirror-symmetrically disposed about the longitudinal center axis of the main housing, and the movable portion are in sandwiched engagement with the wedging members.

8. The apparatus of claim 6, wherein the wedging surface of the wedging member and an inclined surface of the movable portion are in slidable abutment, and wherein the wedging surface of the wedging member and the inclined surface of the movable portion have inclination angles which are complementary, the inclination angle being with respect to the actuation direction.

9. The apparatus of claim 4, wherein the movable portion comprises a main body extending in a transverse direction which is orthogonal to the actuation direction, wherein the main body comprises a plurality of inclined surfaces including a first inclined surface on a first lateral side and a second inclined surface on a second lateral side, and wherein the first inclined surface of the movable portion is in wedging engagement with the first wedging member and the second inclined surface of the movable portion is in wedging engagement with the second wedging member.

10. An electrical apparatus comprising a main housing, electronic and/or electrical circuitries housed inside the main housing, and an actuation mechanism which is configured to actuate or de-actuate the apparatus, the actuation mechanism comprising a movement assembly including a movable portion and a wedge mechanism, wherein the main housing comprises a first housing portion and a second housing portion, the second housing portion being movable relative to the first housing portion in a first direction between a first relative position and a second relative position;

wherein the movable portion is received inside the first housing portion and is movable in the first direction relative to the main housing between a non-actuation position and an actuation position; and wherein the wedge mechanism is configured to move the movable portion from the non-actuation position to the actuation position in an actuation direction which is parallel to the first direction;

wherein the wedge mechanism comprises a wedging portion on the second housing portion, and wherein the wedging portion comprises a wedging member which extends in a longitudinal direction between a first longitudinal end and a second longitudinal end, the longitudinal direction being parallel to the actuation direction; and wherein the wedging member comprises a wing portion including a first flank portion which tapers on extending in the actuation direction from the second longitudinal end to the first longitudinal end to define a wedging surface, and wherein the wedging surface has a wedging angle of 15 degrees or less, including 3, 4, 5, 6, 7, 8, 9, 10, 11, 12, 13, 14, 15 degrees or a range or ranges formed by a combination of the aforesaid values, the wedging angle being with respect to the actuation direction.

11. The apparatus of claim 10, wherein the first flank portion has a length of 3 cm or more, including 3, 4, 5, 6, 7, 8, 9, 10, 11, 12, 13, 14, 15 cm or a range or ranges formed by a combination of the aforesaid values.

12. The apparatus of claim 10, wherein the wing portion comprises a second flank portion and a crest, wherein the crest is intermediate the first flank portion and the second flank portion such that the second flank portion, the crest and the first flank potion are distributed sequentially in the actuation direction, and wherein the second flank portion tapers on extending in a de-actuation direction is opposite to the actuation direction to define a retention surface.

13. The apparatus of claim 10, wherein the wing portion projects into the first housing portion so that its wedging surface is in wedging engagement with a corresponding wedging component inside the first housing portion.

14. The apparatus of claim 10, wherein the wing portion projects inwardly towards a longitudinal center axis of the main housing, and has a varying width which defines the wedging surface, the width being measured in a transverse direction is orthogonal to the longitudinal direction.

15. The apparatus of claim 10, wherein the wedging portion comprises a first wing portion and a second wing portion, and wherein the first wing portion and the second wing portion projects inwardly into the first housing portion and extend towards each other.

16. The apparatus of claim 15, wherein the second housing portion comprises a top portion and a plurality of lateral portions including a first lateral portion and a second lateral portion, wherein the top portion is a center portion which extends along a longitudinal direction defined by a longitudinal center axis, wherein the first lateral portion extending downwardly from a first lateral side of the top portion, wherein the second lateral portion extending downwardly from a second lateral side of the top portion, and wherein the first wing portion projects inwardly into the first housing portion from near a downward end of the first lateral portion and the second wing portion projects inwardly into the first housing portion from near a downward end of the second lateral portion.

17. The apparatus of claim 10, wherein the first housing portion comprises a track portion which defines a sliding track along which the second housing portion is to slide relative to the first housing portion to move in the actuation direction, and wherein the second housing portion is attached to the first housing portion by cooperation between the second wedging portion and the track portion.

18. The apparatus according to claim 10, wherein the first housing portion comprises a battery compartment and a circuitry compartment, wherein the movable portion is received inside the circuitry compartment, and wherein the wedge mechanism is configured to move the movable portion towards the battery compartment.

19. The apparatus according to claim 18, wherein the circuitries comprise a first set of battery contact terminals and a second set of battery contact terminals which cooperate with the battery compartment to define a battery receptacle, wherein the first set of battery contact terminals is a set of movable terminals that is movable by the movement assembly, wherein the battery receptacle is configured for releasable reception and engagement of batteries, wherein batteries in the battery receptacle are to enter into compressive contact with the first and second sets of battery contact terminals when the second housing is moved into the actuation position, and wherein batteries in compressive contact with the first and second sets of battery contact terminals are released for retrieval when the second housing is moved from the actuation position to the non-actuation position.

20. The apparatus according to claim 19, wherein the circuitries are configured for battery charging.

* * * * *